United States Patent
Gupta et al.

(10) Patent No.: US 12,495,487 B2
(45) Date of Patent: Dec. 9, 2025

(54) FLEX-PCB INTEGRATED PACKAGING FOR SILICON PHOTONICS LiDAR

(71) Applicant: Intel Corporation, Santa Clara, CA (US)

(72) Inventors: Sanjeev Gupta, Santa Rosa, CA (US); Jin Hong, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 816 days.

(21) Appl. No.: 17/555,022

(22) Filed: Dec. 17, 2021

(65) Prior Publication Data

US 2022/0400548 A1 Dec. 15, 2022

Related U.S. Application Data

(60) Provisional application No. 63/209,747, filed on Jun. 11, 2021.

(51) Int. Cl.
*H05K 1/02* (2006.01)
*G01S 7/481* (2006.01)

(52) U.S. Cl.
CPC .......... *H05K 1/0281* (2013.01); *G01S 7/4816* (2013.01); *H05K 1/0274* (2013.01); *H05K 1/0298* (2013.01); *H05K 2201/10378* (2013.01); *H05K 2201/10719* (2013.01)

(58) Field of Classification Search
CPC .. H05K 1/0281; H05K 1/0274; H05K 1/0298; H05K 2201/10378; H05K 2201/10719; H05K 1/141; H05K 1/181; H05K 3/4691; H05K 1/147; G01S 7/4816
See application file for complete search history.

(56) References Cited

U.S. PATENT DOCUMENTS

| | | | | |
|---|---|---|---|---|
| 6,402,562 B1 * | 6/2002 | Chang | ................ | H01R 12/7029 439/607.02 |
| 8,604,603 B2 * | 12/2013 | Lau | ................ | H01L 23/5384 257/713 |
| 11,223,756 B1 * | 1/2022 | Sharma | ................ | G03B 30/00 |
| 2003/0156443 A1 * | 8/2003 | Moriarty | ................ | H05K 1/0246 365/233.13 |
| 2005/0011677 A1 * | 1/2005 | Yoshino | ................ | H05K 3/4038 174/263 |
| 2005/0265008 A1 * | 12/2005 | Chamberlin | ......... | H05K 1/0263 361/767 |
| 2012/0067636 A1 * | 3/2012 | Kim | ................ | H05K 3/4694 174/260 |
| 2012/0207437 A1 * | 8/2012 | Kang | ................ | G02B 6/4283 385/88 |
| 2012/0301149 A1 * | 11/2012 | Pinguet | ................ | H10D 88/00 398/115 |

(Continued)

*Primary Examiner* — William B Partridge
*Assistant Examiner* — David Paul Sedorook
(74) *Attorney, Agent, or Firm* — Alliance IP, LLC

(57) ABSTRACT

Various embodiments disclosed relate to LiDAR systems. The present disclosure includes a method and assemblies for connection photonics modules to LiDAR systems. In an example, a connection assembly can include a system board, a flex printed circuit board (PCB) connected to the system board through an interface, a photonics integrated circuit die mounted on a first side of the flex PCB and an electronic integrated circuit die mounted on a second side of the flex PCB, opposite the first side.

20 Claims, 5 Drawing Sheets

(56) References Cited

U.S. PATENT DOCUMENTS

| | | | |
|---|---|---|---|
| 2013/0065422 A1* | 3/2013 | Van Swearingen | ............................ H01R 13/6395 439/378 |
| 2013/0163210 A1* | 6/2013 | Sanford | ................. H05K 1/147 29/841 |
| 2015/0042421 A1* | 2/2015 | Kato | ....................... H01P 3/085 156/182 |
| 2018/0306990 A1* | 10/2018 | Badihi | ................. G02B 6/4448 |
| 2019/0033542 A1* | 1/2019 | Epitaux | ................ G02B 6/4226 |
| 2022/0166522 A1* | 5/2022 | Paraiso | ................... H10F 77/50 |

* cited by examiner

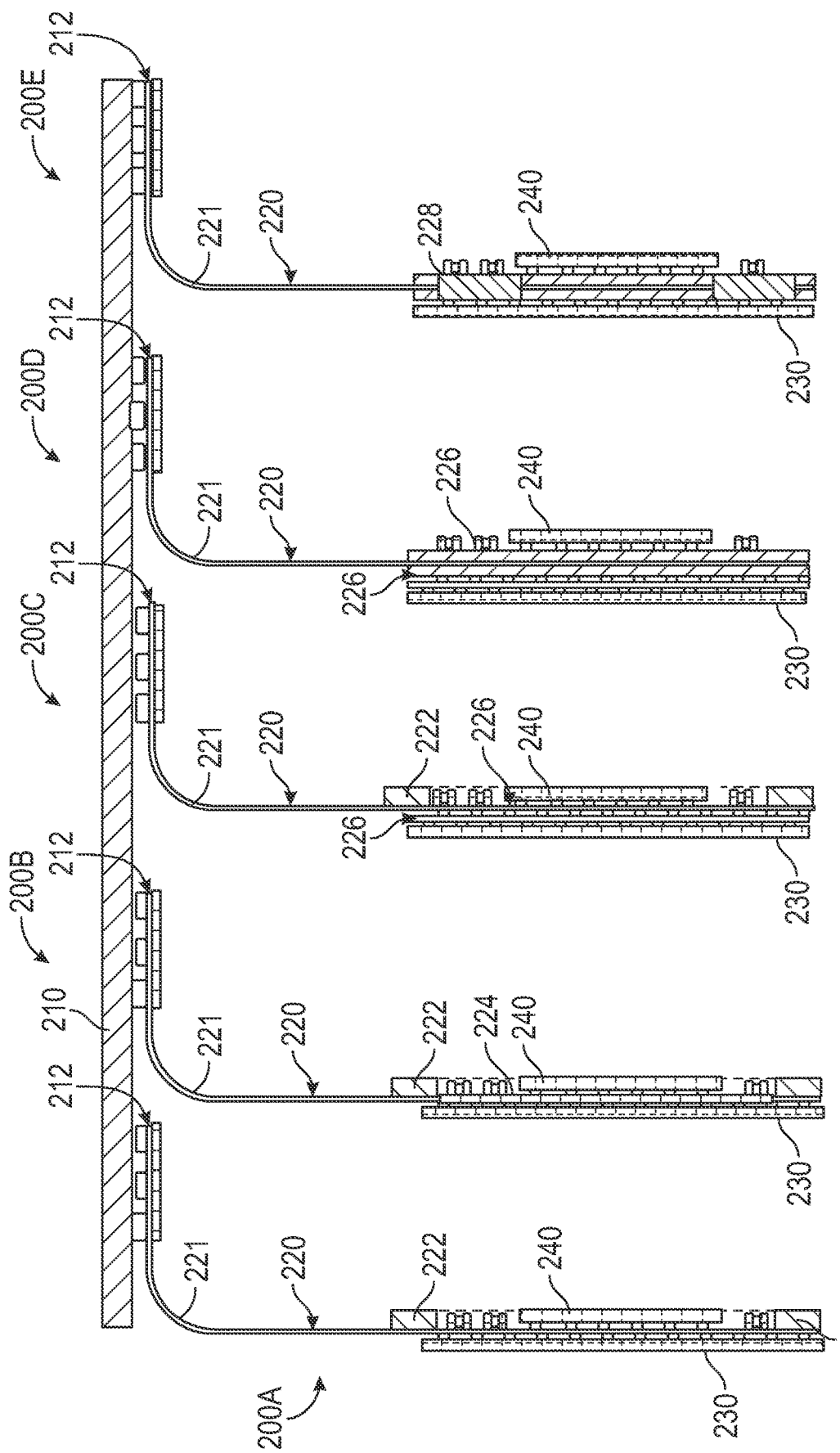

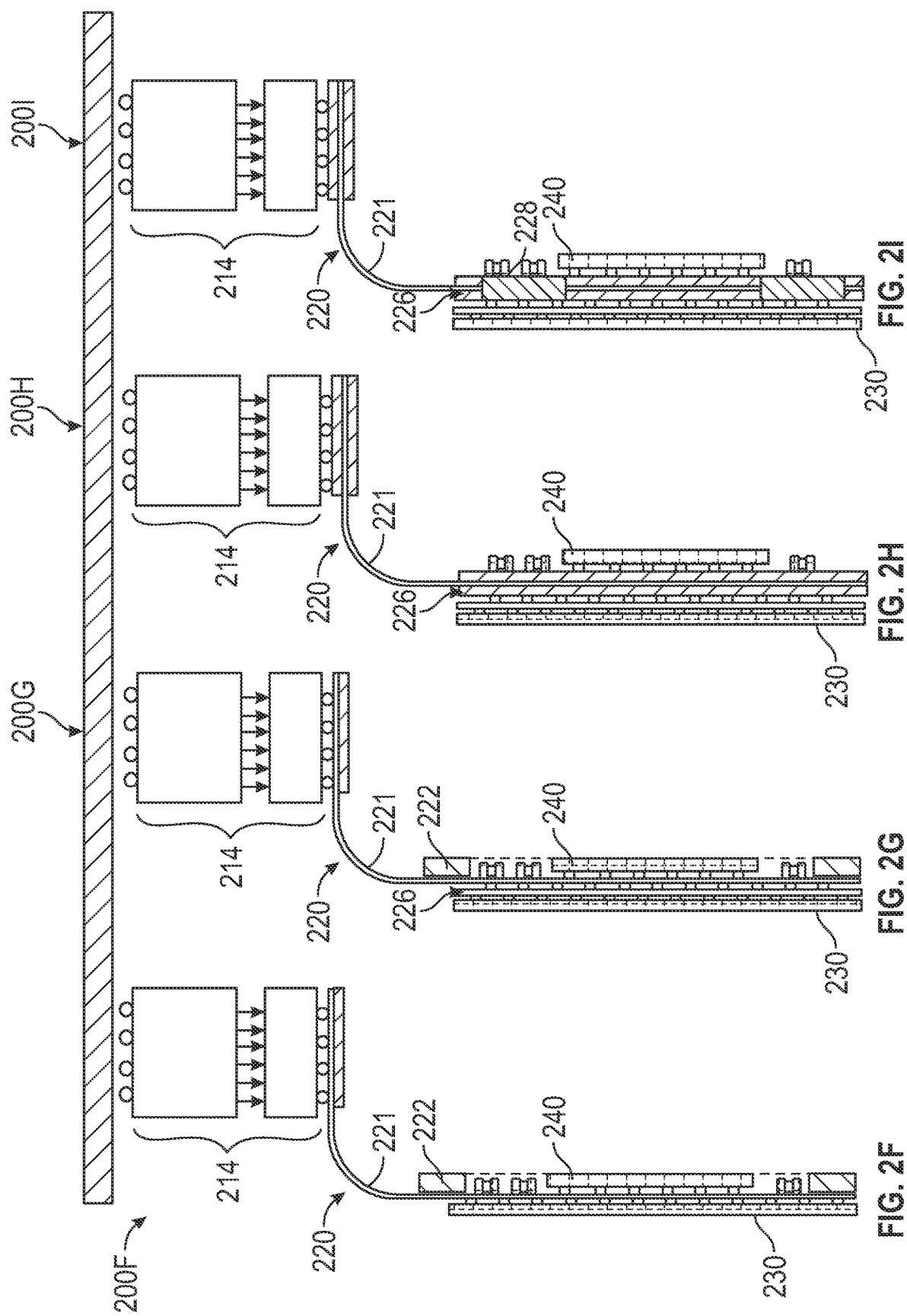

FLEX-PCB INTEGRATED PACKAGING FOR SILICON PHOTONICS LiDAR

CROSS-REFERENCE TO RELATED APPLICATIONS

This application claims the benefit of priority under 35 U.S.C. 119(e) to U.S. Provisional Patent Application Ser. No. 63/209,747, filed Jun. 11, 2021, which is incorporated herein by reference in its entirety.

TECHNICAL FIELD

Embodiments described herein generally relate to semiconductor assembly architecture, and specifically to semiconductor assemblies with silicon photonics.

BACKGROUND

Silicon photonics are a good candidate for low cost and high-performance components, such as for increasing data centric technology. But packaging silicon photonics can be challenging and result in compatibility and integration challenges due to mode field diameter mismatch and tight alignment tolerance. It is desired to have a low cost and efficient packaging technology that address these concerns, and other technical challenges.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIGS. 2A to 2I are schematic diagrams depicting architectures for connecting a photonics module to a LiDAR system in an example.

DETAILED DESCRIPTION

Figure 1:
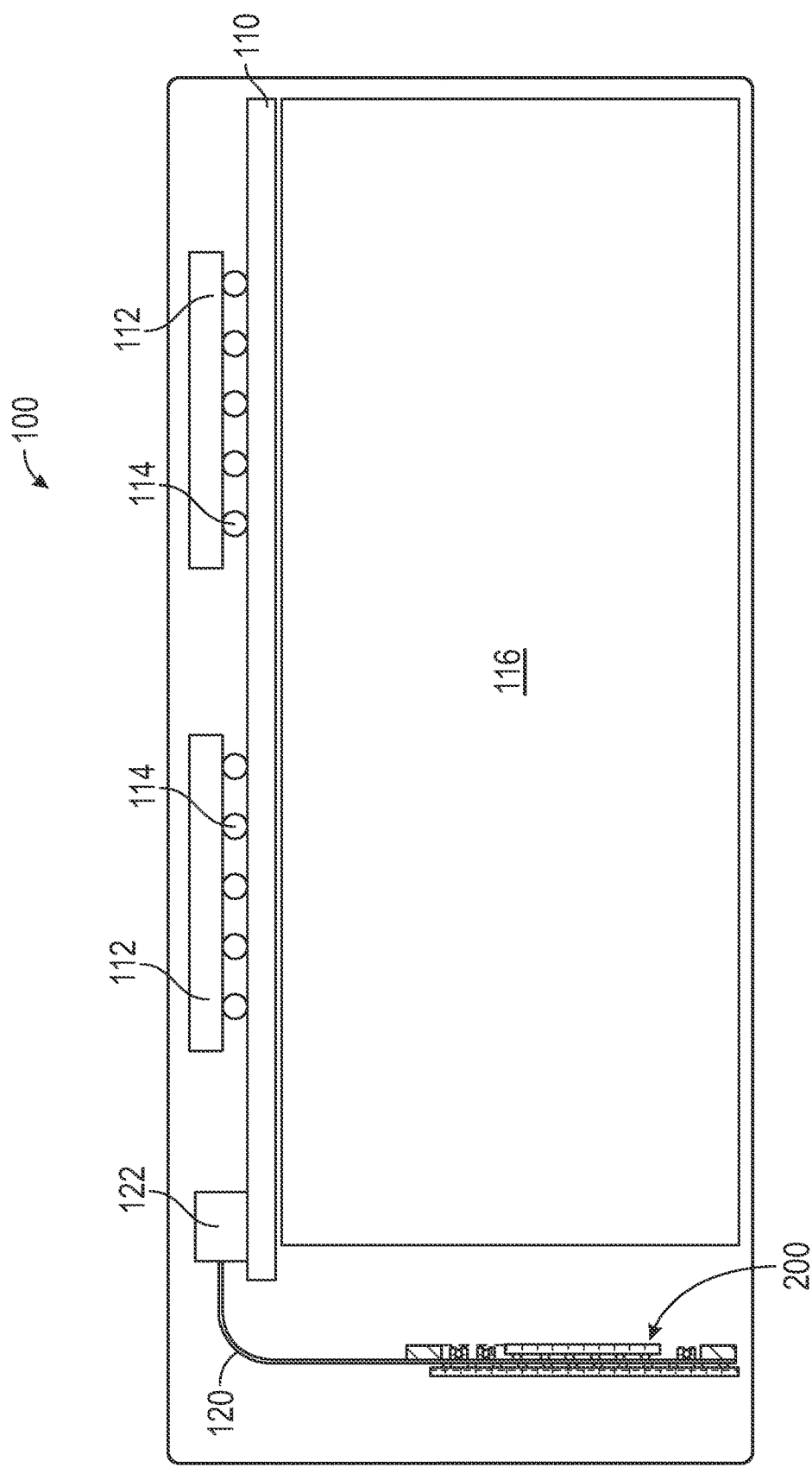
FIG. 1 is a schematic diagram of a LiDAR system in an example.

The present disclosure describes, among other things, packaging methods and architectures for integration of a flex-based printed circuit board (PCB) with a mounted silicon photonics integrated circuit (PIC) into a Light Detection and Ranging (LiDAR) system. A flex or rigid-flex PCB can be used to attach a PIC to a LiDAR host board in a manner to reduce stress on the optical and electrical components. One or more electronic integrated circuits (EICs) can be attached on the flex PCB opposite the PIC to allow for smaller interconnect lengths. Using a flex PCB can allow for a desired orientation of the components relative the LiDAR system, without use of a separate cable assembly for the connection.

In LiDAR systems, complex packaging can create unique challenges. Specifically, the bulk of the space in a LiDAR system can be occupied by mechanical and optical assemblies, leaving less room for printed circuit boards (PCB) desired for connection to PIC and EIC components.

In some LiDAR systems, photonics modules including PICs, EICs such as trans-impedance amplifiers (TIAs), and other control circuitry can be enclosed in a separate housing called a "gold box". Within the gold box PICs can be mounted on a separate carrier material, such as an AlN carrier, for better heat dissipation. Within the gold box, TIAs can be mounted on a PCB using a non-conductive epoxy. In a gold box configuration, conductive traces (e.g., radio frequency (RF) traces) run a long distance from the edged of the PICs to photodiodes such as to allow wire bonding with the TIAs. This conductive tracing can be very dense due to a large number of channels present in such LiDAR systems. Moreover, such wire-bonds require wire bond pads on the edge of the assembly. These can increase the size and cost of a LiDAR system relying on a gold box configuration. Additionally, in a gold box LiDAR configuration, the long conductive traces can degrade performance and increase crosstalk, limiting LiDAR range.

In LiDAR systems with a gold box, the gold box can be connected to the LiDAR system board and other components by a separate cable assembly. The cable assembly can attach the gold box to the LiDAR system board at about a ninety degree angle, which can cause a host of challenges. These challenges can include attachment of the gold box to the host board, meeting thermal requirements for the gold box, and precision alignment of the gold box to optics systems in the LiDAR system.

In a LiDAR system, LiDAR range can be determined by the dynamic range of the LiDAR receiver. The receiver dynamic range is defined as the difference between the highest and lowest amplitude of the optical signal a LiDAR receiver can process without introducing distortion. The highest intensity of the received optical signal can be limited by the non-linearity of the TIA while the lowest signal amplitude a LiDAR system can receive is limited by the system noise, which can include TIA input-referred noise, crosstalk noise between channels, power supply noise, and others. For an extended LiDAR range, the silicon photonics, including PICs, should be able to process a weak received signal, limiting crosstalk and power supply noise. Tight limitations on signal and power integrity can be beneficial.

Overall, gold box user in LiDAR systems can cause a variety of challenges. The gold box orientation relative the LiDAR system board, the alignment of the gold box and PICs therein, and a large number of conductive channels in a LiDAR system with this configuration, can present many challenges for LiDAR system architecture.

Discussed herein are systems and methods for attachment of photonics modules, including PICs and TIAs, to LiDAR systems. The interfaces discussed herein can be cost-effective PCB interfaces between PICs and the system board. The discussed connectors can meet a ninety-degree orientation requirement, and improve signal integrity and power integrity. This can additionally help reduce channel-to-channel crosstalk noise and improve system sensitivity, which improving power supply noise and extending LiDAR range. Moreover, the discussed systems and methods can help reduce system costs by eliminating multiple connector interfaces.

The discussed systems and methods can include use of a flex or rigid-flex PCB for connecting the photonics module to the LiDAR system board. PICs can be mounted on the flex or rigid-flex PCB, which can reduce stresses on lasers and other PIC components. EICs, including TIAs, can be mounted on an opposing side of the flex or rigid-flex PCB. This can help minimize the interconnect length between the PICs and the EICs. The use of a flex or rigid-flex PCB can help with alignment of the photonics module relative the LiDAR system board, and reduce or eliminate a separate cable assembly connector.

In silicon photonics, lasers and semiconductor optical amplifiers (SOAs) can be quite sensitive. The performance of lasers and SOAs can be degraded with the slightest induced stresses. For example, coefficient of thermal expansion (CTE) mismatch between PICs and carrier PCBs can cause such stresses. Stresses can also be generated through the underfill material.

As discussed herein, such stress in silicon photonic devices can be reduced by the use of ultra-low CTE materials, such as for the flex or rigid-flex PCB used herein; by avoiding uses of underfill materials as feasible; use of embedded ceramic carriers in the flex or rigid-flex PCB used herein to create a matched CTE environment; use of stiffener elements to reduce thermal expansion of the flex or rigid-flex PCB used herein; use of silicon interposers or through silicon via (TSV) to reduce thermal expansion of the flex or rigid-flex PCB used herein: or use of a silicon interposer embedded in the flex or rigid-flex PCB used herein, among other methods.

In an example, a semiconductor assembly can include a system board, a flex printed circuit board (PCB) connected to the system board through an interface, a photonics integrated circuit die mounted on a first side of the flex PCB, and an electronic integrated circuit die mounted on a second side of the flex PCB, opposite the first side.

In an example, a light detection and ranging system cam include a host board, a photonics module coupled to the host board, a mechanical subsystem coupled to the host board, an optical subsystem coupled to the host board, and one or more signal processing integrated circuits coupled to the host board. The photonics module can include a flex printed circuit board (PCB) connected to the system board through an interface, a photonics integrated circuit die mounted on a first side of the flex PCB, and an electronic integrated circuit die mounted on a second side of the flex PCB, opposite the first side.

In an example, a method of connecting a photonics module to a light detection and ranging system can include attaching a photonics integrated circuit die on a first side of a flex printed circuit board, attaching an electronic integrated circuit die on a second side of the flex printed circuit board opposite the first side, and connecting the flex printed circuit board to a system board of the light detection and ranging system.

Various examples of photonics module to LiDAR system board connectors, using flex or rigid-flex PCB, are discussed below with reference to FIGS. 1 to 3. In some cases, such a LIDAR system can potentially be used for automated driving, such as with artificial intelligence, blind spot detection, or other uses.

FIG. 1 is a schematic diagram of a LiDAR system 100 in an example. System 100 can include a system board 210, a signal processing integrated circuits 112, a ball grid array 114, mechanical and optical subsystem 116, a connector 220, a mount 212, and a photonics module 200.

In the system 100, the system board 210 of the LiDAR system can be mounted on a top surface of the mechanical and optical subsystems 116. The system board 210 can act as the signal processing unit of the LiDAR system. The photonics module 200 can include one or more PICs, and can act as the transmitter and receiver of an optical signal. The photonics module 200 can be connected to the mechanical and optical subsystem 116 through the connector 220, mount 212, and the system board 210. The system board 210 can also host the signal processing integrated circuits 112.

The system board 210 can be, for example, a printed circuit board (PCB) that mechanically and electrically supports components in system 100, or another type of motherboard. The system board 210 can contain single, double, or multiple layers. The system board 210 can host traces of conductive material (e.g., copper trace), in addition to pads of conductive material to allow for electrical connection. The system board 210 can additionally host vertical connectors, such as, for example, via, micro-via, or plated through holes (PTH). The system board 210 may host and support additionally components, semiconductor dies, or connectors.

In the system 100, the system board 210 can be, for example, a host board, such as a PCB or other appropriate material. The system board 210 can serve as an electrical connection point for various components in the system 100 such as the photonics module 200, the mechanical and optical subsystem 116 and the signal processing integrated circuits 112. The system board 210 can be a laminated sandwich structure of conductive and insulating layers, such as for connection of various electrical components in the LiDAR system. The system board 210 can be for both affixing components within the system and for creating electrical connections.

The signal processing integrated circuits 112 can be one or more integrated circuits connected to the system board 210, such as opposite the mechanical and optical subsystem 116, for receiving one or more signals from the mechanical and optical subsystem 116 and/or photonics module 200. The signal processing integrated circuits 112 can be configured to receive and process such signals, so as to convert and direct the signals for use. The ball grid array 114 can connect the signal processing integrated circuits 112 to the system board 210.

The mechanical and optical subsystem 116 can help in function of the LiDAR system 100, such as by collecting, receiving, and transmitting various electrical or optical signals in the function of the LiDAR system 100.

The connector 220 and the mount 212 can help secured the photonics module 200 to the system 100, as discussed in detail with reference to FIGS. 2A to 2I and 3 below. The photonics module 200 can act as the transmitter and receiver of an optical signal, and thus can work with the mechanical and optical subsystem 116. The photonics module 200 can be precisely aligned with a lens (e.g., a telescopic lens) to transmit and receive optical signals.

In the system 100, the connector 220 can be a flex PCB or rigid-flex PCB. The photonics module 200 can be mounted on the connector 220, such as by a flip-chip method. Other EICs (e.g., trans-impedance amplifiers) can be mounted on the connector 220 on an opposing side.

In some cases, the connector 220 can allow for an arbitrary orientation of the photonics module 200 relative the system board 210. This can help reduce laser stress while meeting thermal, signal integrity, power integrity, and PCB orientation requirements. The connector 220 can, in some cases, replace or reduce long radio frequency (RF) and power supply traces that would otherwise run the length of the photonics module 200.

FIGS. 2A to 2I are schematic diagrams depicting architectures for connecting a photonics module 200 to a LiDAR system in an example. The photonics module 200 can be connected to the system board 210 through the connector 220. In various examples, the connector 220 can include a flex or rigid-flex PCB. A variety of flip-chip IC and SMD components can be mounted on the flex or rigid-flex PCB, such as to provide bias, control, sense, and monitor circuits within the system 100.

Examples discussed with reference to FIGS. 2A to 2I can be directed to incorporating a flex PCB as the carrier for silicon photonics and the EICs, providing flexible orientation with respect to the LiDAR system board, and reducing the interconnect length between the PICs and TIAs. Various examples can include the use of single layer or multiple PIC attachment directly on the flex PCB, such as through flip chip techniques.

In FIG. 2A, the system 100 can include the photonics module 200A, the system board 210, the mount 212, and the connector 220 with a bend 221. The photonics module 200A can include stiffener 222, PIC 230, and TIA 240.

The photonics module 200A can be attached to the system board 210 through the flex PCB type connector 220 and mounted via the hot bar mount 212 at a roughly ninety-degree angle. The PIC 230 can be mounted to the connector 220 on a side opposite that of the TIA 240. The stiffener 222 can be mounted don the flex PCB type connector 220.

The mount 212 can be a hot bar interface. A hot bar process can be used to connect the gold box to the host board, therefore an expensive cable assembly and the need to have a mating connector on the gold box and host board can be eliminated. The hot bar process can include a reflow soldering process to attach the connector 220 to the system board 210. The mount 212 can be at a far end of the connector 220 to connect the connector 220 to the system board 210. The mount 212 can be a hot bac mechanism. In some cases, the connector 220 can be split into multi flex PCB pieces as it leaves photonics module 200A towards the mount 212. In this case, the connector 220 can be hot bar attached on two sides of the system board 210.

The connector 220 can be a flex PCB type material and mounted through the hot bar mount 212 to the system board 210. The connector 220 can allow for electrical connection of the photonics module 200 to the rest of the LiDAR system 100. The connector 220 can be electrically connected to the PIC 230 and the TIA 240 through the connector 220. The connector 220 can extend along the length of the photonics module 200A, from the mount 212 on the system board 210 down between the PIC 230 and the TIA 240. Flex PCB can be used as connectors, and as full circuits assembled with components. Flex PCB can hold soldering heat, and withstand high temperature based on the used film material type.

A hot bar process can include a pulsed heat thermode soldering methods. A hot bar process can be a joining technology where two pre-tinned parts are heated to the melting point of the tin. The joining technology results can produce an electro-mechanical joint.

The process energy can be supplied by a "thermode" (e.g., a hot bar). The thermode can be pressed on the upper part to transfer the thermal energy to both parts. In some cases, a single pair of the connector 220 can be used to connect the photonics module 200A to the system board 210.

The photonics module 200A can be connected at an angle relative the system board 210 such as at the bend 221. The bend 221 can be adjusted on the connector 220 to allow for a ninety-degree or near-ninety-degree bend for situating the photonics module 200A relative the system board 210. The bend 221 can be manipulated for an appropriate angle for the optical signals entering and leaving the photonics module 200A.

The stiffener 222 can be, for example, a frame type or ring type stiffener located on the connector 220 flex PCB to help secure the connector 220 and the photonics module 200A.

The stiffener 222 can be used to increase reliability of the flex PCB connector 220 and reduce stress on the laser or other optical components in the photonics module 200A. The stiffener 222 can be relatively large in comparison to the connector 220. The stiffener 222 can help dissipate heat and stabilize thermal expansion, such as due to CTE mismatch, between the photonics module 200A and the connector 220, such as during a reflow process. The stiffener 222 can be attached below the connector region to provide the mechanical strength to the connector 220. The stiffener 222 can also be used to tie to the system board 210 using a screw to improve mechanical stability.

In some cases, the stiffener 222 can be supplemented or replaced by a silicon interposer, a ceramic interposer, through silicon via, or other mechanically strengthening components. Such components can help reduce stress on the PIC 230 and the photonics module 200A to allow for more effective and efficient movement of optical signals therein, such as by laser.

The PIC 230 and TIA 240 can be IC dice in the photonics module 200A. The semiconductor dice can be mounted on the connector 220. The PIC 230 can be mounted on the connector 220 away from the system board 210 in the photonics module 200A. The PIC 230 can be configured to produce and receive multiple optical signals, such as in the visible or infrared (IR) spectrum. The PIC 230 can include single or multiple optical ports where optical signals exit the PIC 230 for use elsewhere in the LiDAR system. Discussed herein, to both encase and allow electrical connection to those components with reduced crosstalk, a flip chip process can be used apply the PIC 230 to the connector 220, and to reduce signal integrity losses and crosstalk degradation that would otherwise be caused by wire-bond connections.

The EIC dice can be a variety of types of EICs, such as the Transimpedance Amplifiers (TIA) 240. A TIA is a current to voltage converter, such as can be used to amplify current output of the PIC die 230. The TIA 240 can include an integrated circuit, such as a silicon material with layers of MOSFETS integrated into a chip. The TIA 240 can be a faster, smaller, and less expensive construction compared to discrete components.

Additionally or alternatively EIC dice can be mounted on the connector 220 and/or the system board 210. Dice can be, for example, a central processing unit (CPU), a platform controller hub/chipset die (PCH), a graphic processing unit (GPU), a memory die, a field programmable gate array (FGPA) or other semiconductor die. Semiconductor dice can be coupled to the connector 220 through a plurality of solder bumps or other interconnects.

In the system 100, the PIC 230 and TIA 240 can be attached on both sides of the connector 220 through flip chip and underfill assembly to create an electrical connection between the PIC 230 and TIA 240. In system 100, the connector 220 can be hot bar attached to the system board 210. This can help create the electrical connection between the PIC 230 and the TIA 240. The TIA 240 can be mounted as a flip-chip device on the opposite side of the PIC 230, such as to reduce the interconnect length between the PIC 230 and the TIA 240.

Multiple other EIC, such as other flip chip IC and SMD components, can be mounted on the flex PCB connector 220. These other EIC dice can provide bias, control, sense, monitoring of circuits, and other benefits.

FIG. 2B depicts a schematic diagram of a photonics module 200B. Here, the system 100 can include the photonics module 200B, the system board 210, the mount 212, and the connector 220 with a bend 221. The photonics module 200A can include stiffener 222, PIC 230, and TIA 240, in addition to a silicon interposer 224. The components of the photonics module 200B can be similar to those discussed above with reference to FIG. 2A, except where otherwise noted.

In photonics module 200B, the connector 220 can include the silicon interposer 224 embedded in the flex PCB of the connector 220. The silicon interposer 224 can be, for example, a multi-layer silicon interposer. Here, the PIC 230 can the TIA 240 can be mounted on the flex PCB of the connector 220 opposite each other, aligned over the silicon interposer 224. The silicon interposer 224 can provide additional mechanical strength to the connector 220 in an area near the photonics module 200B. This can help reduce stress on lasers therein. The silicon interposer 224 can also reduce underfill requirements for the photonics module 200B, and reduce the stress on the photonics module 200B.

FIG. 2C depicts a schematic diagram of a photonics module 200C. Here, the system 100 can include the photonics module 200C, the system board 210, the mount 212, and the connector 220 with a bend 221. The photonics module 200C can include stiffener 222, PIC 230, and TIA 240, in addition to through silicon via 226. The components of the photonics module 200C can be similar to those discussed above with reference to FIG. 2A, except where otherwise noted.

In photonics module 200C, the connector 220 can include the through silicon via 226 can be situated in the flex PCB of the connector 220. The through silicon via 226 can run across the flex PCB of the connector 220 between the PIC 230 and the TIA 240. This can help provide mechanical strength to the photonics module 200C, and to reduce stress on lasers and SOA therein. In some cases, a multilayer silicon interposer can be used instead of or in addition to the through silicon via 226.

FIG. 2D depicts a schematic diagram of a photonics module 200D. Here, the system 100 can include the photonics module 200D, the system board 210, the mount 212, and the connector 220 with a bend 221. The photonics module 200D can include stiffener 222, PIC 230, and TIA 240, in addition to the through silicon via 226. The components of the photonics module 200D can be similar to those discussed above with reference to FIG. 2A, except where otherwise noted.

In the photonics module 200D, the connector 220 can be made of a rigid-flex PCB instead of a flex PCB. A rigid-flex PCB can be a circuit board that has both rigid circuit sections and flex circuit sections, laminated together. Rigid-flex PCBs may not have the flex part laminated; such rigid-flex PCBS could be soldered or connected with it through a connector. A rigid flex PCB can include more layers than the flex PCB discussed above, and can allow for an easier fanout of the photonics module 200D. Added metal layers in the rigid-flex PCB can help improve power integrity and isolation between various conductive traces in the photonics module 200D.

FIG. 2E depicts a schematic diagram of a photonics module 200E. Here, the system 100 can include the photonics module 200E, the system board 210, the mount 212, and the flex-rigid PCB connector 220 with a bend 221. The photonics module 200E can include stiffener 222, PIC 230, and TIA 240, in addition to a ceramic insert 228. The components of the photonics module 200E can be similar to those discussed above with reference to FIG. 2A, except where otherwise noted.

In photonics module 200E, the rigid-flex PCB connector 220 can additionally include a ceramic insert 228 to mechanically strengthen the photonics module 200E. The ceramic insert 228 can be, for example, an aluminum nickel ceramic or other appropriate material. The ceramic insert 228 can additionally help in heat dissipation. The ceramic insert 228 can help reduce stress on the photonics module 200E.

FIG. 2F depicts a schematic diagram of a photonics module 200F. Here, the system 100 can include the photonics module 200F, the system board 210, a mount 214, and the connector 220 with a bend 221. The photonics module 200F can include stiffener 222, PIC 230, and TIA 240. In the photonics module 200F, the mount 214 can include a connection such as a land grid array (LGA). The components of the photonics module 200F can be similar to those discussed above with reference to FIG. 2A, except where otherwise noted.

In the photonics module 200F, the LGA mount 214 can be a connector instead of a hot bar soldered attachment to the system board 210. The LGA mount 214 can be a high-speed connection interface for mating the with system board 210, such as a surface-mount packaging for integrated circuits (ICs) with pins on the socket rather than the integrated circuit.

FIG. 2G depicts a schematic diagram of a photonics module 200G. Here, the system 100 can include the photonics module 200G, the system board 210, the LGA mount 214, and the flex PCB connector 220 with a bend 221. The photonics module 200G can include stiffener 222, PIC 230, and TIA 240, in addition to a silicon interposer 224. The components of the photonics module 200G can be similar to those discussed above with reference to FIG. 2A, except where otherwise noted. In the photonics module 200G can include a flex PCB connector 220, and a silicon interposer 224 to mechanically strengthen the photonics module 200G. The LGA mount 214 can be a high speed LGA interconnect.

FIG. 2H depicts a schematic diagram of a photonics module 200H. Here, the system 100 can include the photonics module 200H, the system board 210, the LGA mount 214, and the rigid-flex PCB connector 220 with a bend 221. The photonics module 200H can include stiffener 222, PIC 230, and TIA 240, in addition to a through silicon via 226. The components of the photonics module 200H can be similar to those discussed above with reference to FIG. 2A, except where otherwise noted. In the photonics module 200H, the connector 220 can be a rigid-flex PCB, and a through silicon via 226 can be included on the photonics module 200H. The LGA mount 214 can be a high speed LGA interconnect.

FIG. 2I depicts a schematic diagram of a photonics module 200I. Here, the system 100 can include the photonics module 200I, the system board 210, the mount 212, and the connector 220 with a bend 221. The photonics module 200I can include stiffener 222, PIC 230, and TIA 240, in addition to a ceramic insert 228. The components of the photonics module 200I can be similar to those discussed above with reference to FIG. 2A, except where otherwise noted. In the photonics module 200I, the connector 220 can be a rigid-flex PCB, and a ceramic insert 228 can be included on the photonics module 200I. The LGA mount 214 can be a high speed LGA interconnect.

In the examples shown and discussed with reference to FIGS. 2A to 2I, a variety of methods and architectures can be used in various combinations to reduce stresses on the photonics module, such as, but not limited to, the use of ultra-low CTE material for a flex PCB connector design, limited user of underfill material, use of a ceramic insert embedded in the flex or rigid-flex PCB connector to create a matched CTE environment, use of a stiffener on the flex or rigid-flex PCB connector to reduce thermal expansion of the connector during SMD processes, use of a silicon interposer or through silicon via between the PIC and the flex or rigid-flex PCB connector, and use of an embedded silicon interposed in the flex or rigid-flex PCB connector.

In any of the above examples, an optical signal from the photonics module can be connected through a variety of methods. In some cases, the PIC on the flex or rigid-flex PCB connector can be connected through solder bumps and/or via connecting to EIC such as TIA on another surface of the flex or rigid-flex PCB connector. This can improve signal integrity and crosstalk performance, while reducing the overall size of the photonics module.

Figure 3:
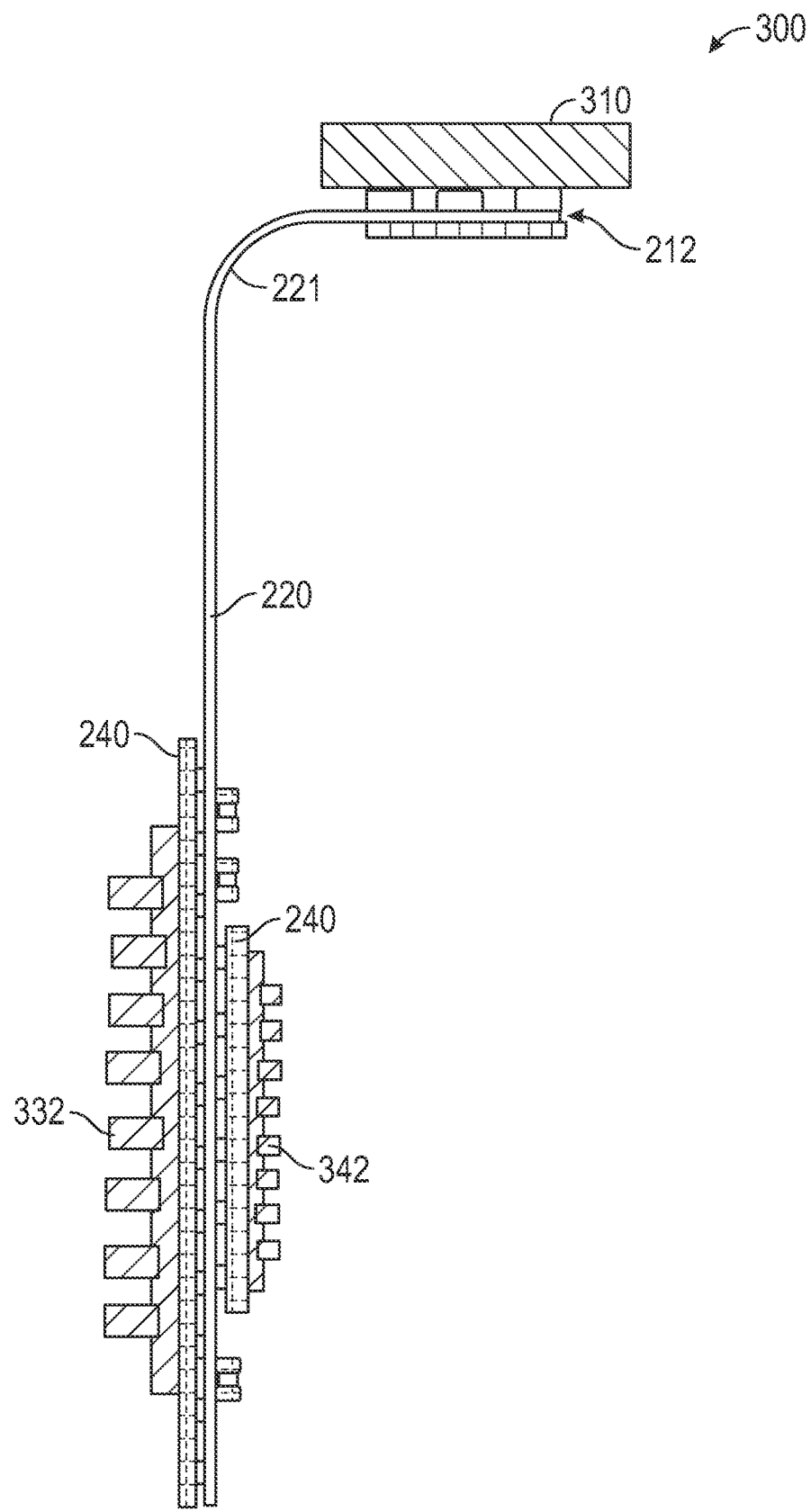
FIG. 3 is a schematic diagram depicting an architecture for connecting a photonics module to a LiDAR system in an example.

FIG. 3 is a schematic diagram depicting an architecture for connecting a photonics module 200 to a LiDAR system in an example. FIG. 3 depicts a schematic diagram of a photonics module 200. Here, the system 100 can include the photonics module 200, the system board 210, the mount 212, and the connector 220 with a bend 221. The photonics module 200 can include stiffener 222, PIC 230, and TIA 240, in addition to two heat sinks 332, 342. The components of the photonics module 300 can be similar to those discussed above with reference to FIG. 2A, except where otherwise noted.

The heat sinks 332, 342, can be integrated on top of the PIC 230 and the TIA 240, respectively. Silicon photonics and TIAs can require much higher power dissipation in a multichannel LiDAR application. Thus, thermal performance of the photonics module 200 is important. The thermal performance of this subsystem can be managed by pulling the heat out from the top of the flip-chip PIC 230 and the electrical TIA 240 using heat sinks 332, 334 connected directly to the IC surfaces as shown. In some cases, the heat sinks 332, 334, can be integrated on top of the PIC 230 and TIA 240.

Figure 4:
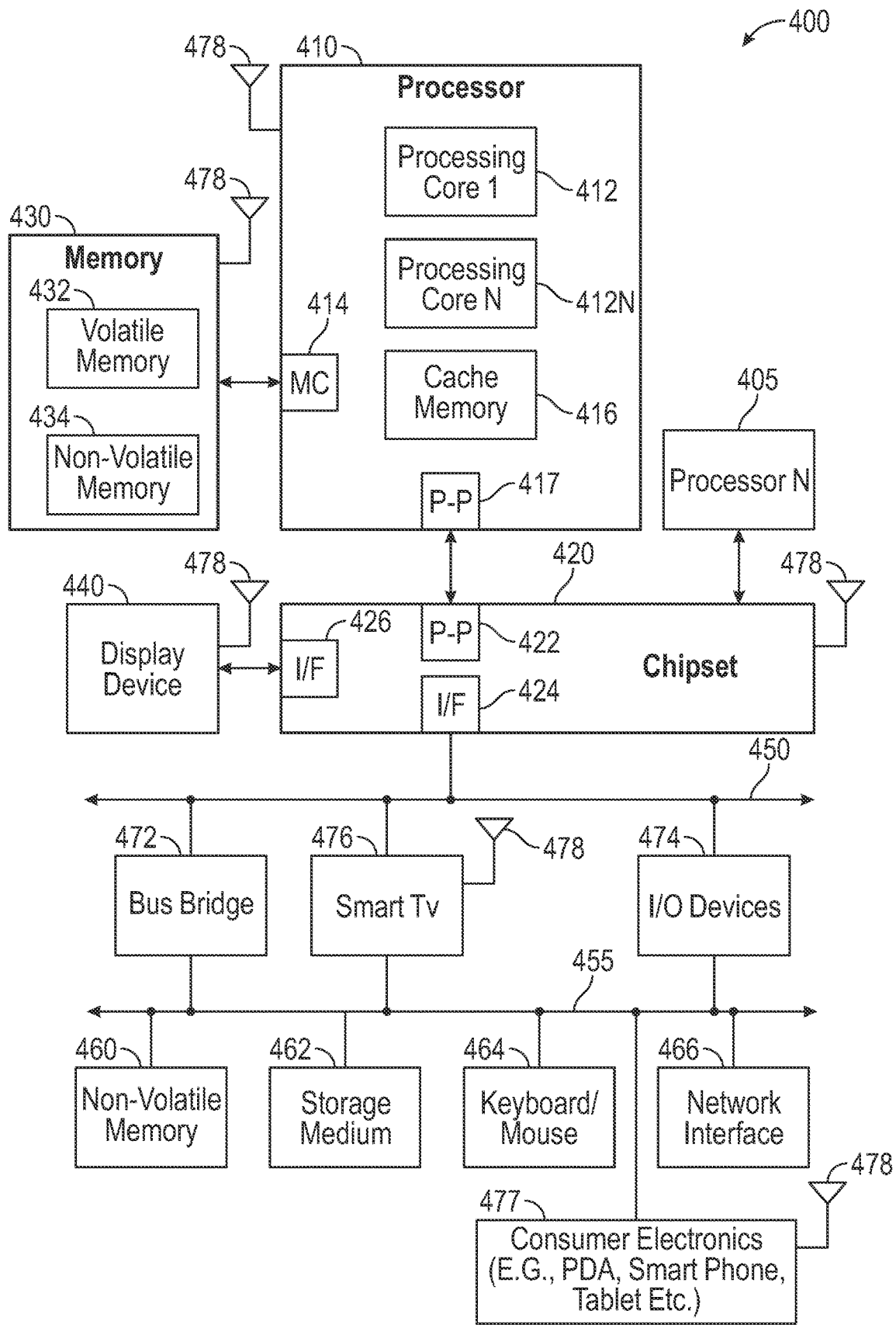
FIG. 4 is a system level diagram in an example.

FIG. 4 illustrates a system level diagram, depicting an example of an electronic device (e.g., system) including the photonics system 100 as described in the present disclosure. FIG. 4 is included to show an example of a higher level device application for the system 100. In one embodiment, system 400 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 400 is a system on a chip (SOC) system.

In one embodiment, processor 410 has one or more processor cores 412 and 412N, where 412N represents the Nth processor core inside processor 410 where N is a positive integer. In one embodiment, system 400 includes multiple processors including 410 and 405, where processor 405 has logic similar or identical to the logic of processor 410. In some embodiments, processing core 412 includes, but is not limited to, pre-fetch logic to fetch instructions, decode logic to decode the instructions, execution logic to execute instructions and the like. In some embodiments, processor 410 has a cache memory 416 to cache instructions and/or data for system 400. Cache memory 416 may be organized into a hierarchal structure including one or more levels of cache memory.

In some embodiments, processor 410 includes a memory controller 414, which is operable to perform functions that enable the processor 410 to access and communicate with memory 430 that includes a volatile memory 432 and/or a non-volatile memory 434. In some embodiments, processor 410 is coupled with memory 430 and chipset 420. Processor 410 may also be coupled to a wireless antenna 478 to communicate with any device configured to transmit and/or receive wireless signals. In one embodiment, an interface for wireless antenna 478 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 432 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 434 includes, but is not limited to, flash memory, phase change memory (PCM), read-only memory (ROM), electrically erasable programmable read-only memory (EEPROM), or any other type of non-volatile memory device.

Memory 430 stores information and instructions to be executed by processor 410. In one embodiment, memory 430 may also store temporary variables or other intermediate information while processor 410 is executing instructions. In the illustrated embodiment, chipset 420 connects with processor 410 via Point-to-Point (PtP or P-P) interfaces 417 and 422. Chipset 420 enables processor 410 to connect to other elements in system 400. In some embodiments of the example system, interfaces 417 and 422 operate in accordance with a PtP communication protocol such as the Intel® QuickPath Interconnect (QPI) or the like. In other embodiments, a different interconnect may be used.

In some embodiments, chipset 420 is operable to communicate with processor 410, 405N, display device 440, and other devices, including a bus bridge 472, a smart TV 476, I/O devices 474, nonvolatile memory 460, a storage medium (such as one or more mass storage devices) 462, a keyboard/mouse 464, a network interface 466, and various forms of consumer electronics 477 (such as a PDA, smart phone, tablet etc.), etc. In one embodiment, chipset 420 couples with these devices through an interface 424. Chipset 420 may also be coupled to a wireless antenna 478 to communicate with any device configured to transmit and/or receive wireless signals.

Chipset 420 connects to display device 440 via interface 426. Display 440 may be, for example, a liquid crystal display (LCD), a plasma display, cathode ray tube (CRT) display, or any other form of visual display device. In some embodiments of the example system, processor 410 and chipset 420 are merged into a single SOC. In addition, chipset 420 connects to one or more buses 450 and 455 that interconnect various system elements, such as I/O devices 474, nonvolatile memory 460, storage medium 462, a keyboard/mouse 464, and network interface 466. Buses 450 and 455 may be interconnected together via a bus bridge 472.

In one embodiment, mass storage device 462 includes, but is not limited to, a solid state drive, a hard disk drive, a universal serial bus flash memory drive, or any other form of computer data storage medium. In one embodiment, network interface 466 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 4 are depicted as separate blocks within the system 400, the functions performed by some of these blocks may be integrated within a single semiconductor circuit or may be implemented using two or more separate integrated circuits. For example, although cache memory 416 is depicted as a separate block within processor 410, cache memory 416 (or selected aspects of 416) can be incorporated into processor core 412.

Various Notes & Examples

Example 1 is a semiconductor assembly comprising: a system board; a connector attached to the system board through an interface at a proximal end, the connector comprising a flex printed circuit board (PCB); a strengthening element on the connector; a photonics integrated circuit die mounted on a first side of the connector at a distal end of the connector; and an electronic integrated circuit die mounted on a second side of the connector, opposite the first side, a distal end of the connector.

In Example 2, the subject matter of Example 1 optionally includes wherein the flex PCB comprises a flex or a rigid-flex PCB.

In Example 3, the subject matter of any one or more of Examples 1-2 optionally include wherein the flex PCB comprises multiple layers.

In Example 4, the subject matter of any one or more of Examples 1-3 optionally include wherein the interface comprises a hot bar interface.

In Example 5, the subject matter of any one or more of Examples 1-4 optionally include wherein the interface comprises a land grid array (LGA) interface.

In Example 6, the subject matter of any one or more of Examples 1-5 optionally include wherein the strengthening element comprises a stiffener on the flex PCB, the stiffener comprising a frame.

In Example 7, the subject matter of any one or more of Examples 1-6 optionally include wherein the strengthening element comprises an interposer on the flex PCB between the photonics integrated circuit die and the electronic integrated circuit die.

In Example 8, the subject matter of any one or more of Examples 1-7 optionally include wherein the strengthening element comprises an interposer embedded in the flex PCB.

In Example 9, the subject matter of any one or more of Examples 1-8 optionally include wherein the strengthening element comprises one or more through silicon via between the photonics integrated circuit die and the electronic integrated circuit die.

In Example 10, the subject matter of any one or more of Examples 1-9 optionally include wherein the strengthening element comprises an embedded dielectric spacer.

In Example 11, the subject matter of Example 10 optionally includes wherein the embedded dielectric spacer comprises a ceramic.

In Example 12, the subject matter of any one or more of Examples 1-11 optionally include a heat sink on the photonic integrated circuit.

In Example 13, the subject matter of any one or more of Examples 1-12 optionally include a heat sink on the electronic integrated circuit.

In Example 14, the subject matter of any one or more of Examples 1-13 optionally include wherein the connector comprises a ninety degree bend.

In Example 15, the subject matter of any one or more of Examples 1-14 optionally include wherein the electronic integrated circuit die comprises a trans-ampediance amplifier.

Example 16 is a light detection and ranging system comprising: a host board; a photonics module coupled to the host board, the photonics module comprising: a flex printed circuit board (PCB) connected to the system board through an interface; and a photonics integrated circuit die mounted on a first side of the flex PCB; and an electronic integrated circuit die mounted on a second side of the flex PCB, opposite the first side; a subsystem coupled to the host board; and one or more signal processing integrated circuits coupled to the host board.

In Example 17, the subject matter of Example 16 optionally includes wherein the photonics module further comprises a lens configured to receive and alter one or more optical signals produced by the photonics integrated circuit.

Example 18 is a method of connecting a photonics module to a light detection and ranging system, the method comprising: attaching a photonics integrated circuit die on a first side of a flex printed circuit board; attaching an electronic integrated circuit die on a second side of the flex printed circuit board opposite the first side; and connecting the flex printed circuit board to a system board of the light detection and ranging system.

In Example 19, the subject matter of Example 18 optionally includes where connecting the flex printed circuit board to the system board comprises a hot bar process.

In Example 20, the subject matter of any one or more of Examples 18-19 optionally include wherein connecting the flex printed circuit board to the system board comprises using a land grid array connection.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

As used herein, the term "module" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable components that provide the described functionality.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A semiconductor assembly comprising:
   a system board;
   a flex-based printed circuit board (PCB) attached to the system board through an interface that is proximate to a first end of the flex-based PCB, wherein the first end of the flex-based PCB is proximal the system board and a second end of the flex-based PCB is distal to the system board, wherein the flex-based PCB comprises a flex or a rigid-flex PCB;
   a strengthening element on the flex-based PCB;
   a photonic integrated circuit die mounted on a first side of the flex-based PCB proximate to the second end of the flex-based PCB; and
   an electronic integrated circuit die mounted on a second side of the flex-based PCB proximate to the second end of the flex-based PCB, the second side opposite to the first side.

2. The semiconductor assembly of claim 1, wherein the flex-based PCB is connected to the system board on a first side of the system board and wherein a second side of the system board is mounted on an optical and mechanical subsystem of a light detection and ranging system, the second side of the system board opposite to the first side of the system board.

3. The semiconductor assembly of claim 1, wherein the flex-based PCB comprises multiple layers.

4. The semiconductor assembly of claim 1, further comprising a second strengthening element on the flex-based PCB, wherein the second strengthening element is closer to the second end of the flex-based PCB than the electronic integrated circuit die, wherein the strengthening element is closer to the first end of the flex-based PCB than the electronic integrated circuit die.

5. The semiconductor assembly of claim 1, wherein the photonic integrated circuit die is connected to the electronic integrated circuit die through at least one solder bump that couples the photonic integrated circuit die to the flex-based PCB.

6. The semiconductor assembly of claim 1, wherein the strengthening element comprises a stiffener on a same side of the flex-based PCB as the electronic integrated circuit die, the stiffener comprising a frame.

7. The semiconductor assembly of claim 1, wherein the strengthening element comprises an interposer on the flex PCB between the photonics integrated circuit die and the electronic integrated circuit die.

8. The semiconductor assembly of claim 1, wherein the strengthening element comprises an interposer embedded in the flex PCB.

9. The semiconductor assembly of claim 1, wherein the strengthening element comprises one or more through silicon via between the photonics integrated circuit die and the electronic integrated circuit die.

10. The semiconductor assembly of claim 1, wherein the strengthening element comprises an embedded dielectric spacer.

11. The semiconductor assembly of claim 10, wherein the embedded dielectric spacer comprises a ceramic.

12. The semiconductor assembly of claim 1, further comprising a heat sink on the photonic integrated circuit.

13. The semiconductor assembly of claim 1, further comprising a heat sink on the electronic integrated circuit.

14. The semiconductor assembly of claim 1, wherein the flex-based PCB comprises a ninety degree bend between a first location of the interface and a second location at which the photonic integrated circuit die is mounted to the flex-based PCB.

15. The semiconductor assembly of claim 1, wherein the electronic integrated circuit die comprises a trans-impedance amplifier.

16. A light detection and ranging system comprising:
a host board;
a photonics module coupled to the host board, the photonics module comprising:
  a flex-based printed circuit board (PCB) connected to the system board through an interface proximate a first end of the flex-based PCB; and
  a photonics integrated circuit die mounted on a first side of the flex-based PCB proximate to a second end of the flex-based PCB; and
  an electronic integrated circuit die mounted on a second side of the flex-based PCB, the second side opposite the first side, the first end of the flex-based PCB proximal to the host board, wherein the second end of the flex-based PCB is distal to the host board;
a subsystem coupled to the host board; and
one or more signal processing integrated circuits coupled to the host board.

17. The system of claim 16, wherein the photonics module further comprises a lens configured to receive and alter one or more optical signals produced by the photonics integrated circuit.

18. A method of connecting a photonics module to a light detection and ranging system, the method comprising:
attaching a photonics integrated circuit die on a first side of a flex-based printed circuit board proximate to a first end of the flex-based printed circuit board;
attaching an electronic integrated circuit die on a second side of the flex-based printed circuit board proximate to the first end of the flex-based printed circuit board, the second side opposite to the first side; and
connecting a second end of the flex-based printed circuit board to a system board of the light detection and ranging system.

19. The method of claim 18, where connecting the flex-based printed circuit board to the system board comprises a hot bar process.

20. The method of claim 18, wherein connecting the flex-based printed circuit board to the system board comprises using a land grid array connection.

* * * * *